United States Patent
Cerini et al.

(10) Patent No.: US 12,068,362 B2
(45) Date of Patent: Aug. 20, 2024

(54) ELECTRODE STRUCTURE HAVING IMPROVED SHAPE, AND ELECTRONIC DEVICE INCLUDING THE ELECTRODE STRUCTURE

(71) Applicant: STMicroelectronics S.r.l., Agrate Brianza (IT)

(72) Inventors: Fabrizio Cerini, Magenta (IT); Silvia Adorno, Novate Milanese (IT); Dario Paci, Vittuone (IT); Marco Salina, Cremosano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/494,475

(22) Filed: Oct. 5, 2021

(65) Prior Publication Data

US 2022/0123105 A1    Apr. 21, 2022

(30) Foreign Application Priority Data

Oct. 15, 2020   (IT) .......................... 102020000024346

(51) Int. Cl.
| | |
|---|---|
| *H01L 23/522* | (2006.01) |
| *H01L 23/528* | (2006.01) |
| *H01L 23/538* | (2006.01) |
| *H01L 49/02* | (2006.01) |

(52) U.S. Cl.
CPC .......... *H01L 28/86* (2013.01); *H01L 23/5223* (2013.01)

(58) Field of Classification Search
CPC ..... H01L 24/05; H01L 23/5283; H01L 28/86; H01L 23/5223; H01L 23/538; H01L 23/5381; H01L 23/5382; H01L 23/5384; H01L 23/5385; H01L 23/5386; H01L 23/5387; H01L 23/5388; H01L 23/5389
See application file for complete search history.

(56) References Cited

U.S. PATENT DOCUMENTS

| | | | |
|---|---|---|---|
| 7,098,540 B1* | 8/2006 | Mohan | H01L 24/05 257/737 |
| 2007/0290343 A1* | 12/2007 | Harada | H01L 24/05 257/737 |
| 2014/0252610 A1* | 9/2014 | Chen | H01L 24/05 257/738 |
| 2015/0243613 A1 | 8/2015 | Chen et al. | |
| 2017/0141055 A1* | 5/2017 | Liu | H01L 24/03 |
| 2018/0374769 A1* | 12/2018 | Fehler | H01L 24/05 |

* cited by examiner

*Primary Examiner* — Omar F Mojaddedi
(74) *Attorney, Agent, or Firm* — Seed IP Law Group LLP

(57) ABSTRACT

An electrode structure includes a pad of conductive material, and a conductive strip having a first end physically and electrically coupled to the pad. The pad includes an annular element internally defining a through opening. The first end of the conductive strip is physically and electrically coupled to the annular element by a transition region so that, when the conductive strip undergoes expansion by the thermal effect, a stress spreads from the conductive strip to the annular element by the transition region.

20 Claims, 5 Drawing Sheets

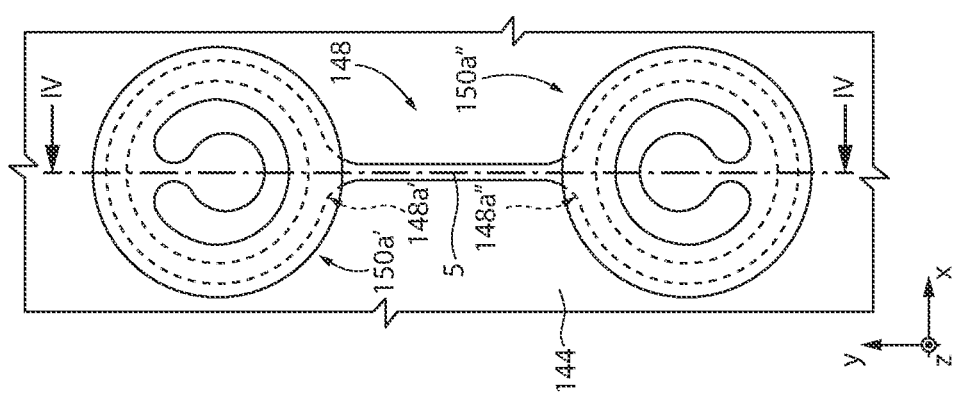
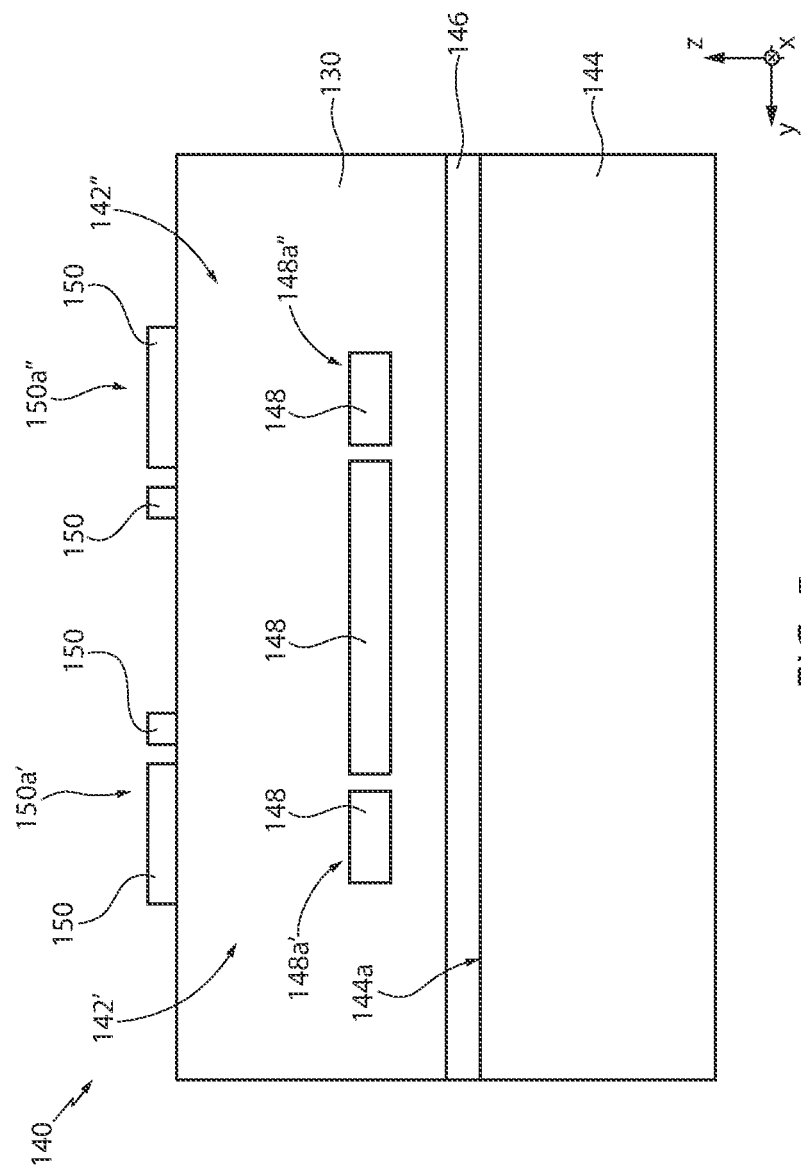
FIG. 4E
FIG. 5

ELECTRODE STRUCTURE HAVING IMPROVED SHAPE, AND ELECTRONIC DEVICE INCLUDING THE ELECTRODE STRUCTURE

BACKGROUND

Technical Field

The present disclosure relates to an electrode structure, such as an electrode or pad, and to an electronic device comprising the electrode structure. In particular, the present disclosure regards an electrode having a conformation such as to enable an efficient and uniform distribution of mechanical stresses thereon, thus reducing an undesired concentration of the stresses.

Description of the Related Art

As is known, electronic devices are commonly present in high-power electronics, which use galvanic insulators, i.e., elements (e.g., oxide layers) designed to guarantee galvanic insulation between groups of elements (e.g., electrodes or pads) set at potentials different from one another.

Various examples of galvanic insulators are known, for instance for insulation of a primary electrode (or pad), of metal such as gold, from a secondary electrode (or pad), of metal such as gold. Such galvanic insulators are materials with high dielectric strength (for example, higher than 400 kV/mm) that withstand high electrical fields, and therefore high potential differences across them, without undergoing electrical breakdown (or perforation) of the dielectric and without becoming electrically conductive.

In particular, a layer of dielectric material (hereinafter, dielectric layer), interposed between the primary electrode and the secondary electrode, can be used as galvanic insulator. Once the type of dielectric layer, having its own dielectric constant and its own dielectric strength, has been chosen, the thickness thereof (measured between the primary electrode and the secondary electrode) is a function of the maximum biasing values to be applied at the electrodes. In general, the greater the maximum voltage difference that the electrodes are to withstand, the greater the thickness of the dielectric layer necessary for guaranteeing galvanic insulation between the electrodes.

In addition, in order to attenuate (in localized regions) the value of the electrical field, it is possible to adopt dielectric materials with a dielectric constant of higher value that are inserted in multilayer dielectric stacks, for example at the interface with the electrodes. The reason for this is that, in a stack of several materials, the field is shared so that the higher the dielectric constant of the material considered, the lower the electrical field within it.

In general, the dielectric layer is obtained by one or more insulating layers, which include for example silicon oxide, or, in more dedicated cases, by an appropriate and multilayer composition of dielectric materials with different dielectric constants, so as to modulate appropriately potential drops and fields within the insulating layers.

In high-power applications it is common to have potential differences at the electrodes in the 5-10-kV range. Typically, the dielectric layer chosen for guaranteeing galvanic insulation thereof is silicon oxide, which, however, cannot exceed a limit thickness (e.g., approximately 10 μm) linked to limits in the quality of the material that can be obtained and to the machinability of the silicon wafer.

In particular, for too high thicknesses of silicon oxide, the effect of the residual mechanical stress (which is markedly compressive with a value of around −300 MPa) transferred to the silicon wafer, causes deformations such as to preclude proper machinability of the wafer in the subsequent process steps. This in effect poses a limit of thickness in the growth of the silicon oxide and consequently also a limit to the maximum withstand voltage, typically not higher than approximately 10 kV.

In the perspective of raising the withstand voltage in the range 15-20 kV (as may be required or desired by the market) and given the limits in thickness of the silicon oxide, use of polymeric materials to form the dielectric layer is a promising alternative. Among the various polymeric materials, such as for example: PSF (polysulfone) or PVDF (polyvinylidene fluoride), the most suited/most widely used for applications of galvanic insulation is photosensitive polyimide, such as PIX (polybenzobisoxazole); having a dielectric constant of approximately 3 and dielectric strength higher than 400 kV/mm.

Given that PIX has a mechanical residual stress after low-tension baking, this in effect allows the problems of warping of the wafer to be overcome, therefore making it possible to obtain dielectric layers with larger thicknesses and to withstand higher maximum voltage differences between the electrodes.

Currently the maximum limit of thickness of PIX (due to limits in the integration of polyimide within the process flow of the device) is approximately 40 μm. In such conditions of thickness, it is possible to reach withstand-voltage values of approximately 15-20 kV, in accordance with market requirements or desires.

However, the dielectric layer of polymeric material and the metal electrodes usually have respective coefficients of thermal expansion (CTE) that are very different from one another, and this may be a critical factor in the manufacture of such electronic devices. In fact, during manufacture of the electronic device (which comprises forming, in mutual succession, the secondary electrode, the dielectric layer, and the primary electrode), the structure that will form the electronic device is subjected to a number of thermal cycles.

In the present case, wherein the dielectric layer has a greater thickness that can be obtained only by multiple consecutive depositions, the thermal cycles of baking of the PIX cause (with each deposition) thermal expansion/compression of the PIX and of the electrodes. The difference of CTE between the dielectric layer and the electrodes induce in the interfaces between the metal and the polymer, as well as in the polymer itself, non-negligible residual mechanical stresses.

The above stresses may assume values such as to lead to damage of the dielectric layer (e.g., the formation of cracks), with consequent reduction in the performance of strength of the galvanic insulation. Such cracks in the dielectric layer are particularly harmful for the electronic device, since they may be difficult to detect during the stage of testing thereof, for example using EWS (Electrical Wafer Sorting) techniques or else AOI (Automated Optical Inspection) techniques.

In detail, the PIX has a maximum tensile stress, beyond which there occurs onset of cracks/mechanical breakdown.

In particular, the regions of the electronic device more subject to such mechanical stresses are those where the PIX is in direct contact with the electrodes (or the wire-bonding pads) and the respective metal connections (e.g., connection tracks).

BRIEF SUMMARY

The aim of the present disclosure is to provide an electrode structure and an electronic device comprising the electrode structure that will overcome the drawbacks of the known art.

According to the present disclosure an electrode structure and an electronic device comprising the electrode structure are provided.

In at least one embodiment, an electrode structure is provided that includes a first pad of conductive material and a conductive strip having a first end physically and electrically coupled to the first pad. The first pad includes a first annular element internally defining a first through opening. The first end of the conductive strip is physically and electrically coupled to the first annular element through a first transition region so that, when the conductive strip undergoes expansion by the thermal effect, a stress is transferred from the conductive strip to the first annular element through the first transition region.

BRIEF DESCRIPTION OF THE SEVERAL VIEWS OF THE DRAWINGS

For a better understanding of the present disclosure, a preferred embodiment is now described, purely by way of non-limiting example, with reference to the attached drawings, wherein:

FIG. 4E is a schematic top view, with parts removed for clarity of representation, of portions of an electronic device, according to a further embodiment of the present disclosure, which include the electrode structure of FIG. 2A (or FIG. 2B); and FIG. 5 is a cross-sectional view, taken along a line of section Iv-Iv represented in FIG. 4E, of the electronic device comprising the portions of FIG. 4E, according to an embodiment of the present disclosure.

DETAILED DESCRIPTION

Elements common to the various different embodiments of the present disclosure, described hereinafter, are designated by the same reference numbers.

Figure 1:
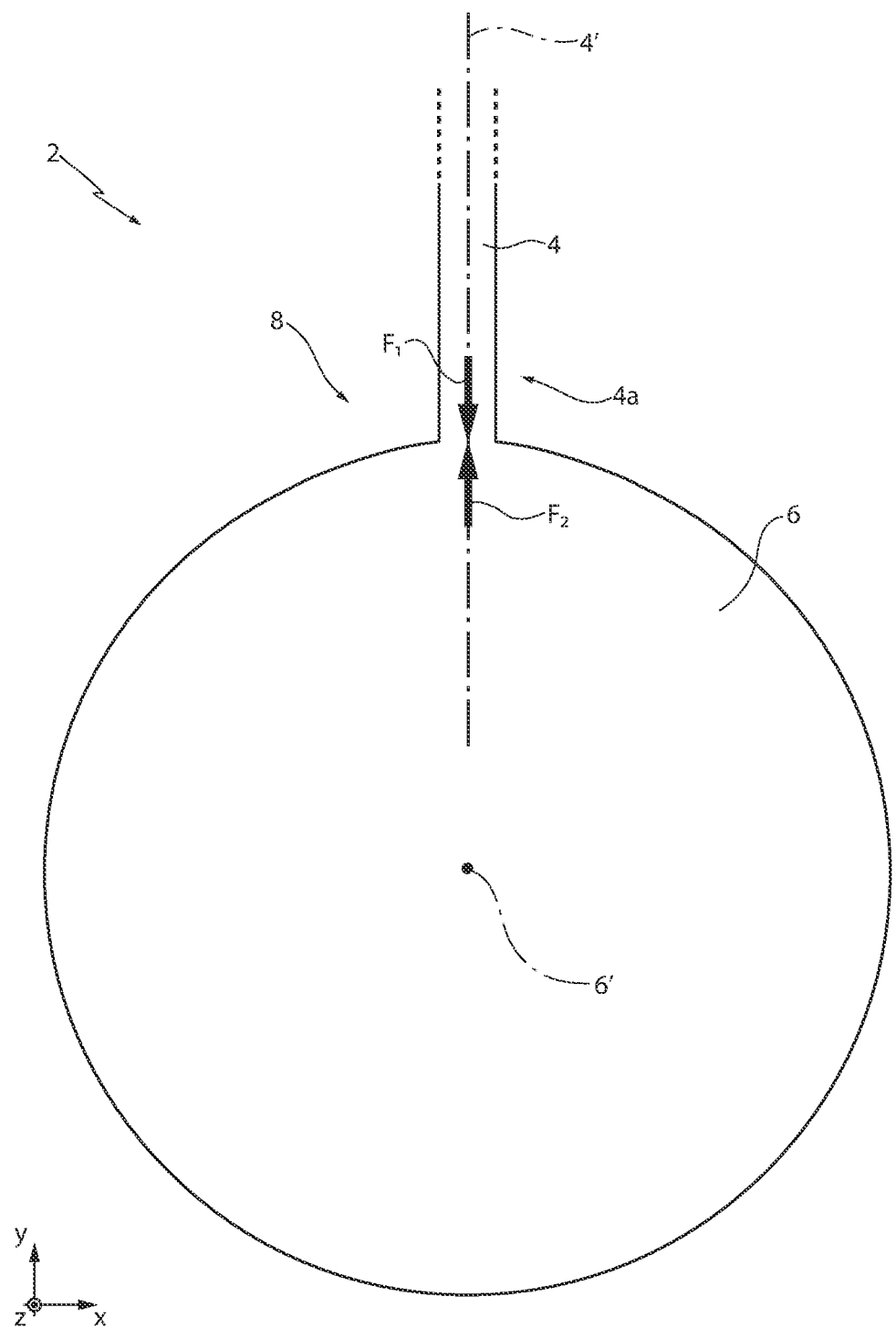
FIG. 1 is a schematic top view of an electrode structure, according to comparative example.

FIG. 1 shows an electrode structure 2 of a comparative example, comprising a metal connection 4 and an electrode (or pad) 6.

The metal connection 4 has a filiform or strip-like shape and therefore extends along its main direction 4'; moreover, the metal connection 4 has one end 4a joined to the electrode 6, and a further end (not illustrated and opposite to the end 4a) joined to a bonding pad (not illustrated and similar to the electrode 6). At the aforesaid ends of the metal connection 4 (i.e., in the electrode-to-strip and pad-to-strip joining portions) respective contact regions are defined (in FIG. 1, the contact region 8). When the metal connection 4 is subjected to a thermal heating process (during manufacture and/or during use), the metal connection 4 undergoes expansion prevalently along said main direction 4'.

The electrode 6 (and likewise, the bonding pad) has, in cross-sectional view, a substantially circular shape. When subjected to a thermal heating process during manufacture and/or during use, the electrode 6 tends to expand radially starting from a central portion 6' thereof.

Consequently, forces $F_1$, $F_2$ act at said contact region 8 when the electrode 6 and the metal connection 4 are heated. The force $F_1$ is caused by expansion of the metal connection 4 and faces towards the electrode 6, and the force $F_2$ is caused by the expansion of the electrode 6 and faces towards the metal connection 4: said forces $F_1$, $F_2$ therefore act substantially along the main direction 4', are parallel to one another and are opposite to one another. The forces $F_1$, $F_2$ induce stress concentration in the contact region 8, and lead to damage and/or breakdown of the dielectric layer (which surrounds the metal connection 4 and the electrode 6) in the contact region 8 if the value of stress in the contact region 8 exceeds the mechanical breakdown threshold of the dielectric.

Example solutions to the above problem include reducing the thickness of the dielectric layer in order to increase the capacity of elastic deformation thereof (therefore, without undergoing damage), but this degrades its properties of withstand voltage of the galvanic insulation.

Alternatively, in order to reduce the stress in the contact region 8, it is possible to design the latter so that it has, in sectional view, a substantially trapezial shape, with a minor base at the metal connection 4 and a major base at the electrode 6; this conformation prevents the presence of sharp edges in the connection between the electrode 6 and the metal connection 4. The presence of lateral concavities in the contact region 8 is shown in FIG. 2B. However, even though, for given ranges of parameters of said shape (e.g., angles at the bases of the trapezium), the shape itself will partially contribute to reducing the stress in the contact region 8, it has been found that outside said ranges of parameters further reduction of stress is not effective enough and/or is not a solution. For these reasons, it is therefore not possible to reduce the stress in the contact region 8 arbitrarily through this solution, and in some cases the possible reduction using the aforesaid techniques is not in any case sufficient to prevent damage (cracks) in the dielectric layer.

Figure 2A:
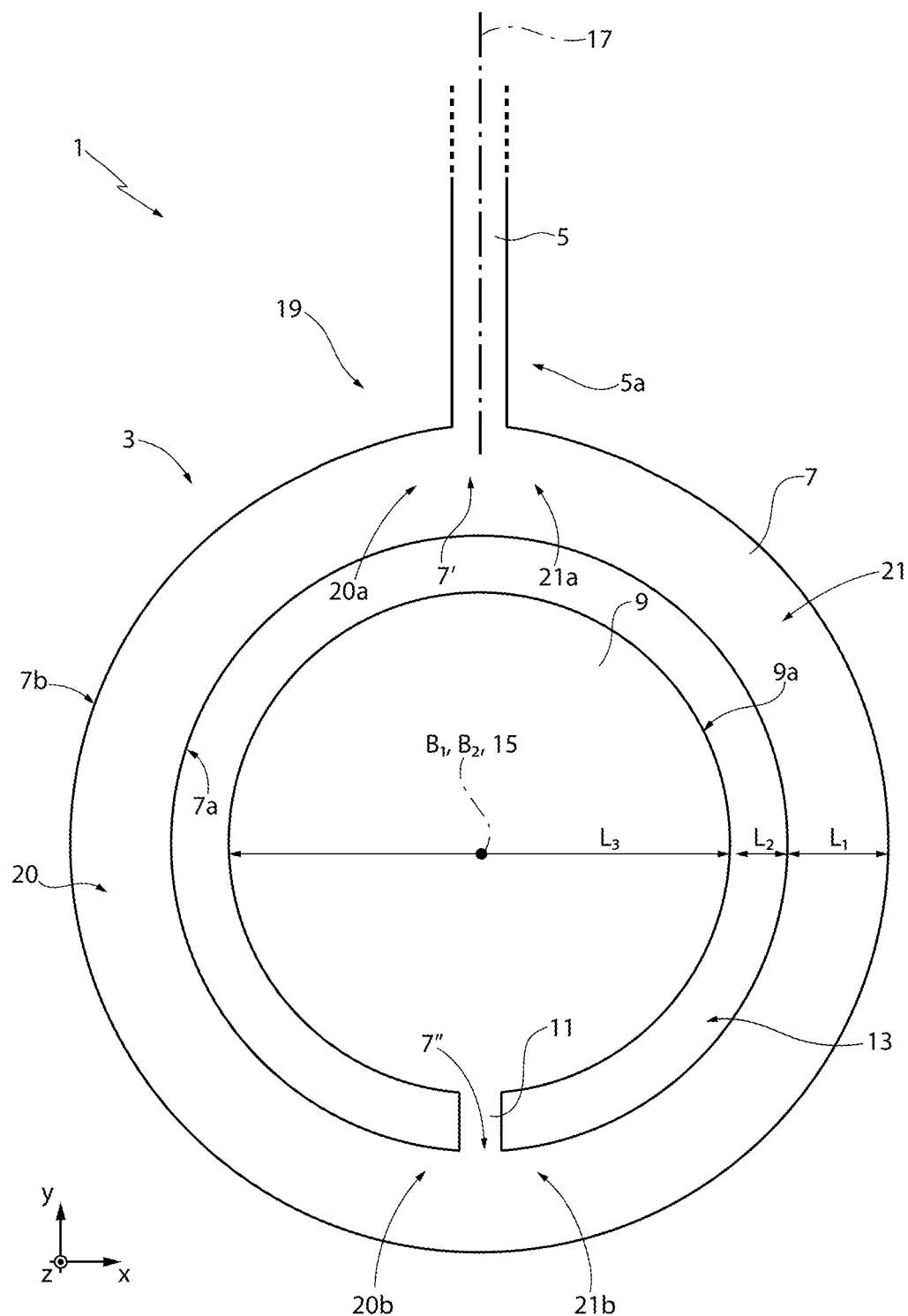
FIG. 2A is a schematic top view of an electrode structure aimed at reducing stress concentration, according to an embodiment of the present disclosure.
Figure 2B:
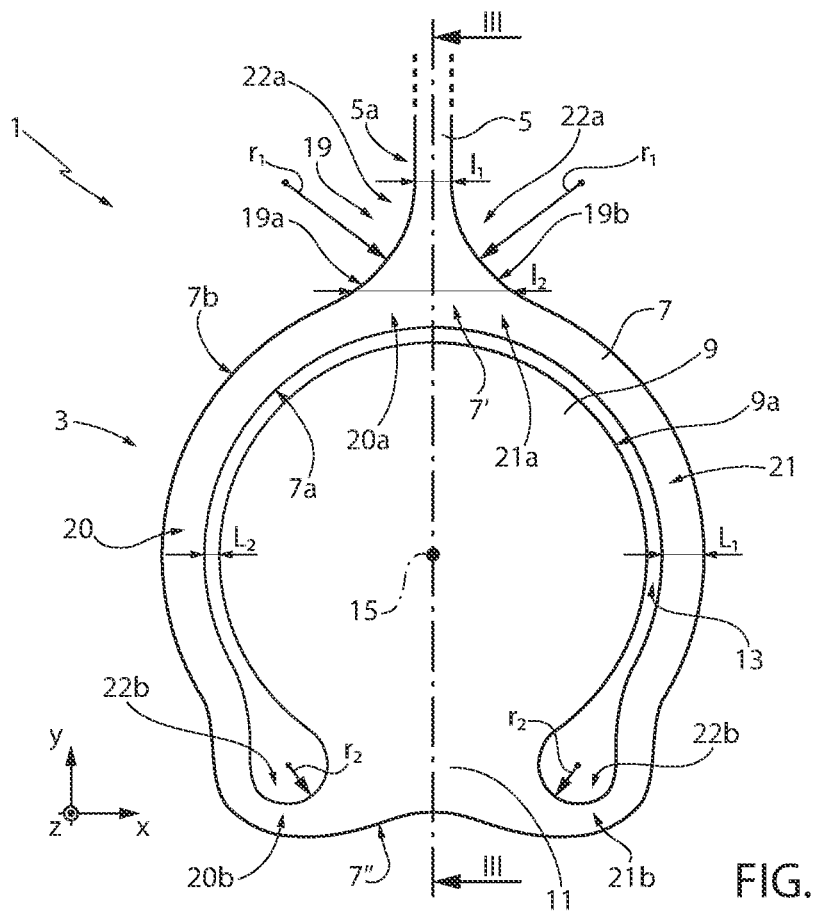
FIG. 2B is a schematic top view of the electrode structure of FIG. 2A, according to an optimized embodiment of the present disclosure.

FIG. 2A shows, in a triaxial Cartesian reference system XYZ defined by the axes X, Y and Z, an electrode structure 1 according to an embodiment of the present disclosure. In particular, FIG. 2A shows the electrode structure 1 in top view, i.e., in a plane XY defined by the axes X and Y.

The electrode structure 1 is, for example, obtained by micromachining steps, known in MEMS technology, and includes an electrode or pad 3 and a connection or conductive track 5 coupled to one or more bonding pads; in turn, the bonding pad can be coupled to a biasing element designed to bias the bonding pad and therefore the electrode 3. For instance, the electrode 3 and the connection 5 are of conductive material such as metal (e.g., gold or copper or aluminum) or doped polysilicon, or some other conductive material designed for the purpose. Reference will be made hereinafter to a metal connection 5, without this implying any loss of generality.

The electrode 3 comprises a decoupling structure and a central body 9, electrically coupled together by a connection portion 11.

The decoupling structure is constituted by an annular element 7 separated from the central body 9 by a through opening 13. In the plane XY, the annular element 7 has, in this example, the shape of a circular crown. However, it is evident that other shapes are possible, for example an oval or a generically curvilinear shape.

The annular element 7 is formed by a conductive track delimited by an inner side 7a and an outer side 7b. The inner side 7a directly faces the central body 9 through the opening 13. The sides 7a, 7b therefore define the circular, oval, or generically curvilinear shape of the annular element 7.

The central body 9 extends within the decoupling structure (i.e., in the through opening 13) and therefore has a perimeter 9a that faces the side 7a. In other words, the annular element 7 surrounds the central body 9 completely. The central body 9 has a substantially circular shape, in the plane XY. Other shapes are, however, possible for the central body 9, amongst which the oval shape, the polygonal shape with chamfered corners, or some other curvilinear shape still.

The shape of the through opening 13 is therefore defined and delimited by the respective shapes of the inner side 7a and of the perimeter 9a of the central body 9.

In one embodiment, in the plane XY the central body 9 has a first centroid $B_1$ and the annular element 7 has a second centroid $B_2$; the centroids $B_1$, $B_2$ substantially coincide with one another and define a center 15 of the electrode 3.

The central body 9 is mechanically and electrically coupled to the annular element 7 by the connection portion 11. The connection portion 11 extends between the central body 9 and the annular element, radially with respect to the center 15 and locally interrupts the through opening 13.

The metal connection 5 has a strip-like shape and has a main extension along a direction 17 (in FIG. 2A, parallel to the axis Y). The metal connection 5 comprises a first end 5a and a second end (not shown in FIG. 2A), opposite to one another along the direction 17. The metal connection 5 is coupled (in particular, is directly connected without any interruptions) to the second side 7b of the annular element 7 by said first end 5a (therefore also referred to hereinafter as coupling end 5a).

Consequently, the metal connection 5 and the annular element 7 are in direct physical and electrical contact with one another. In detail, the metal connection 5 and the annular element 7 are joined together in a contact region 19 that includes the coupling end 5a and a first portion 7' of the annular element 7. Moreover, the annular element 7 includes a second portion 7" at the connection portion 11 and joined to the connection portion 11.

In one embodiment, the connection portion 11 is arranged so as to be radially opposite to the contact region 19 with respect to the center 15. In other words, the first portion 7' and the second portion 7" of the decoupling element 7 are arranged so as to be opposite to one another with respect to the decoupling element 7 (in greater detail, they are opposite to one another with respect to the center 15 along the main direction 17).

It is therefore possible to identify a first arm and a second arm 20, 21 of the annular element 7, curved (in particular, having the shape of a semi-circular crown) and extending between the first portion 7' and the second portion 7", respectively. The arms 20, 21 are connected together by the first portion 7' at respective ends thereof (or first critical regions) 20a, 21a. The arms 20, 21 are likewise connected together by the second portion 7" at further respective ends (or second critical regions) 20b, 21b. The second critical regions 20b, 21b are opposite to the first critical regions 20a, 21a along the axis Y. The present applicant has found that the critical regions 20a, 21a, 20b, 21b are the regions of the annular element 7 that, during the thermal manufacturing processes or deriving from use, undergo the highest concentration of mechanical stress.

In greater detail, the first and second sides 7a, 7b are at a distance from one another by a first length $L_1$, measured along the axis X; the first and third sides 7a, 9a are at a distance from one another by a second length $L_2$, measured along the axis X; and the central body 9, having a circular shape, has a diameter equal to a third length $L_3$, for example measured along the axis X. In one embodiment, the second length $L_2$ is smaller than the first length $L_1$, and the first length $L_1$ is smaller than the third length $L_3$. For instance, $L_1$ is comprised between approximately 10 µm and approximately 25 µm, $L_2$ is greater than or equal to 5 µm, and $L_3$ is such as to generate an area of the electrode 3 congruent with the value of active capacitance (described more fully hereinafter) required or otherwise desired in the design stage; in particular, the relation $L_2 < L_1 < L_3$ applies.

The decoupling structure described enables a better distribution of mechanical stresses due to thermal expansion/compression of the electrode structure 1 when the latter is subjected to thermal processes during manufacture and/or during use.

In fact, when heated, the metal connection 5 undergoes expansion prevalently along the main direction 17, exerting on the annular element 7 a first force that acts on the contact region 19. The first force acts substantially along the main direction 17 (and therefore parallelly to the axis Y) and faces the electrode 3 (in particular, the center 15).

When heated, the central body 9 undergoes radial expansion, i.e., increasing the perimeter of the third side 9a. Consequently, the central body 9 exerts on the annular element 7 a second force that acts, through the connection portion 11, on the second portion 7". The second force acts substantially parallelly to the axis Y and faces the annular element 7 (in particular, the side 7b). The first and second forces are therefore substantially parallel to one another and face in the same direction.

The metal connection 5 and the central body 9 are mechanically coupled together by the annular element 7, which enables decoupling of the first and second forces and enables said forces to be substantially parallel to one another, concordant and distributed over the entire annular element 7.

In detail, the first and second forces are transmitted from the metal connection 5 and, respectively, from the central body 9, to the annular element 7, which, given its shape, enables dissipation thereof both parallelly to the axis Y and parallelly to the axis X. This therefore enables distribution of the stress caused by these forces over the entire annular element 7 and prevents excessive concentrations of stress in a single region (for example, the contact region 19). In particular, on account of the first and second forces, the annular element 7 can undergo elastic deformation, for example passing from a substantially circular shape to a substantially elliptical shape, wherein a major semi-axis is parallel to the axis X and a minor semi-axis is parallel to the axis Y. Deformation of the annular element 7 therefore enables distribution of the first force also parallelly to the axis X (as well as parallelly to the axis Z), and therefore not only parallelly to the axis Y.

Furthermore, when the electrode structure 1 undergoes heating during manufacture and/or during use, a third force and a fourth force are generated that are due to thermal expansion/compression of the annular element 7. In fact, the annular element 7 expands/compresses radially with respect to the center 15, therefore exerting the third force on the coupling end 5*a* and, likewise, exerting a fourth force on the connection portion 11. The third force acts substantially parallel to the axis Y and faces the metal connection 5, and the fourth force acts substantially parallel to the axis Y and faces the connection portion 11. The third and the fourth forces are therefore substantially parallel to one another and to the first and second forces and have the same direction and face in the opposite direction with respect to the first and second forces. However, since in FIG. 2A the first length $L_1$ is much smaller than the third length $L_3$, the third and fourth forces are much smaller than the first and second forces and do not have a significant impact on the stress on the contact region 19 and, respectively, in the connection portion 11.

FIG. 2B shows the electrode structure 1, comprising the electrode and the connection, according to a possible optimized embodiment.

In particular, in FIG. 2B the contact region 19 has, in the plane XY, a tapered shape and has a width, measured parallelly to the axis X, that increases along the axis Y as it approaches the center 15. In other words, the contact region 19 has, at the metal connection 5, a first width $l_1$ measured parallelly to the axis X and has, at the annular element 7, a second width $l_2$ measured parallelly to the axis X; with $l_2$ greater than $l_1$. For instance, the contact region 19 has, in the plane XY, a substantially trapezial shape (e.g., that of an isosceles trapezium with the minor base at the metal connection 5 and with the major base at the annular element 7). Alternatively, as shown in FIG. 2, the contact region 19 has a fourth side and a fifth side 19*a*, 19*b*, both of which are curved (in particular, having a concave shape and defining respective first concavities 22*a*) and opposite to one another parallelly to the axis X: these curved sides are defined by a first radius of curvature $r_1$, for example greater than or equal to approximately 50 μm.

In addition, in FIG. 2B the connection portion 11 and the second portion 7" have at said second critical regions 20*b*, 21*b*, respectively, two second concavities 22*b* facing the through opening 13 and having a substantially circular shape in the plane XY. In other words, the annular element 7 is joined to the central body 9 through regions (including the connection portion 11 and the second portion 7") shaped so as to form the aforesaid second concavities 22*b*. Said second concavities are defined, at least partially, by a second radius of curvature $r_2$, smaller than the first radius of curvature $r_1$. For instance, the second radius of curvature $r_2$ may have a value greater than or equal to approximately 20 μm.

In detail, the smaller the first length $L_1$ (i.e., the distance between the inner side 7*a* and the outer side 7*b*), the greater the concentration of stress in the first and second critical regions 20*a*, 21*a*, 20*b*, 21*b*. Moreover, the greater the second radius of curvature $r_2$, the smaller the concentration of stress in the second critical regions 20*b*, 21*b*. In addition, the smaller the second length $L_2$ (i.e., the distance between the first and third sides 7*a*, 9*a*), the greater the second radius of curvature $r_2$ in order to reduce the concentration of stress in the second critical regions 20*b*, 21*b*. According to one aspect of the present disclosure, the first length $L_1$ is, for example, comprised between approximately 10 μm and approximately 25 μm, and the second length $L_2$ is greater than or equal to approximately 5 μm.

Figure 3:
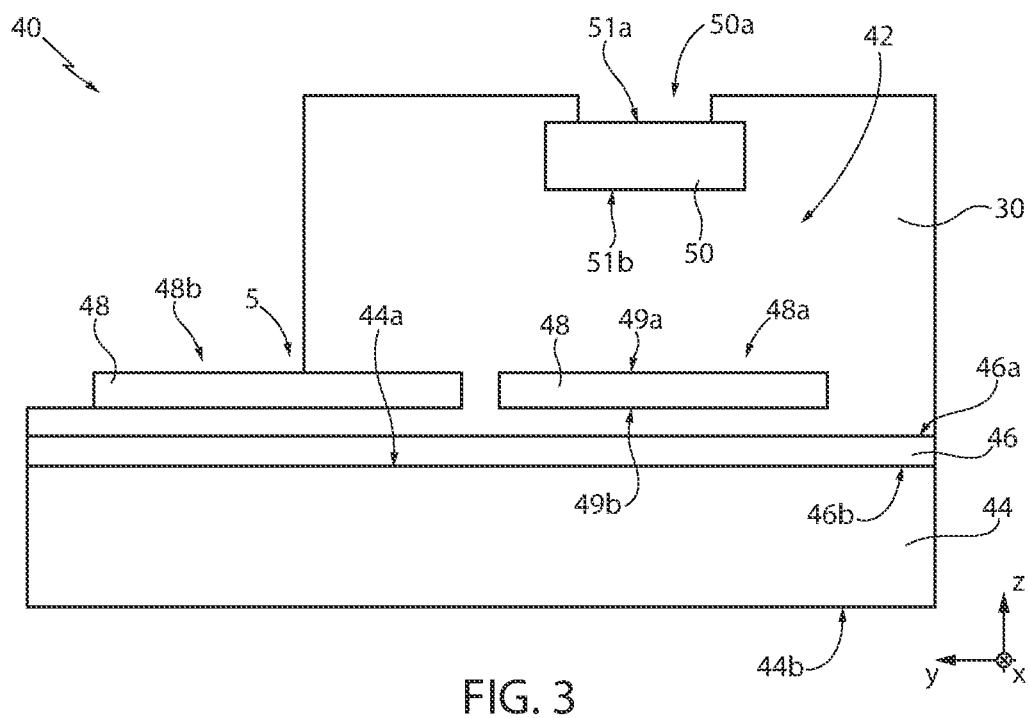
FIG. 3 is a cross-sectional view, taken along a line of section III-III represented in FIG. 2B, of an electronic device comprising the electrode structure of FIG. 2A (or FIG. 2B), according to an embodiment of the present disclosure.

As shown in FIG. 3, the electrode structure 1 (whether according to the embodiment of FIG. 2A or according to the optimized embodiment of FIG. 2B) is at least partially surrounded by the layer 30 of dielectric material. The dielectric layer 30 may, for example, be of polymeric material, in particular photosensitive polyimide, such as PIX (polybenzobisoxazole), PSF (polysulfone), or PVDF (polyvinylidene fluoride). The dielectric layer 30 extends in contact with the electrode 3 and, at least partially, in contact with the metal connection 5. In particular, the dielectric layer 30 extends in contact with the contact region 19, with the second side 7*b* of the annular element 7, with the second portion 7", and moreover extends in the through opening 13 so as to be in contact with the side 7*a*, with the side 9*a*, and with the connection portion 11.

In particular, FIG. 3 shows, in a view in the plane YZ defined by the axes Y, Z and taken along a line of section III-III of FIG. 2, an electronic device 40 including the electrode structure 1. In particular, the line of section III-III is parallel to the axis Y and passes through the center 15.

In the embodiment of FIG. 3, the electronic device 40 includes a capacitor 42.

In detail, the electronic device 40 comprises a substrate 44 of semiconductor material (e.g., silicon) having a front side 44*a* and a back side 44*b* opposite to one another along the axis Z.

The electronic device 40 further comprises an insulating layer 46 (for example, of silicon oxide and/or silicon nitride), formed by known processes, for instance, thermal growth or chemical vapor deposition (CVD); the insulating layer 46 extends on the front side 44*a* of the substrate 44 and has the function of electrically insulating the substrate 44 and the metallization 48 from one another. The insulating layer 46 has a surface 46*a* and a surface 46*b* opposite to one another along the axis Z. The surface 46*b* is in contact with the front side 44*a*.

The dielectric layer 30 extends over the surface 46*a*.

A metallization 48 and a metallization 50 extend, at least partially, in the dielectric layer 30. In particular, the metallizations 48, 50 extend prevalently parallel to the axis XY and parallel to one another along the axis Z. Portions of dielectric layer 30 extend in a direction parallel to the axis Z: between the insulating layer 46 and the metallization 48; between the metallizations 48 and 50; and on the metallization 50. A portion of the metallization 48 forms a plate 48*a* (secondary electrode), and a portion of the second metallization 50 forms the plate 50*a* (primary electrode, to which a high-voltage signal is applied in use). The plates 48*a*, 50*a* and the portion of the dielectric layer 30 interposed between them form the capacitor 42.

The plate 48*a* is similar to the electrode 3 of FIG. 2B and has surfaces 49*a* and 49*b* opposite to one another along the axis Z and, for example, separated from one another by a distance of approximately 5 μm. The surface 49*b* faces the first surface 46*a* through the dielectric layer 30.

Further portions of the metallization 48 form a metal connection (similar to the metal connection 5 and therefore designated hereinafter by the same reference number) and a bonding pad 48*b*. The plate 48*a* is mechanically and electrically connected to the bonding pad 48*b*, of a known type, by the metal connection 5. The dielectric layer 30 completely surrounds the plate 48*a* and partially exposes the bonding pad 48*b* so that the latter can be coupled to a first low-voltage biasing element (not illustrated and external to the electronic device 40), for example by an electrical-connection element (not illustrated, such as a metal wire)

designed to obtain an electrical connection through known techniques, for example wire-bonding techniques.

The plate 50a has a surface 51a and a surface 51b opposite to one another along the axis Z. The plates 48a, 50a are at least partially overlapping one another parallelly to the axis Z so that the surface 51b faces, through the dielectric layer 30, the surface 49a. The dielectric layer 30 exposes, at least partially, the surface 51a so that a second high-voltage biasing element (not illustrated and external to the electronic device 40) can be coupled to the plate 50a, for example by a further electrical-connection element (not illustrated and similar to the previous electrical-connection element), for biasing the plate 50a to a primary voltage $V_1$ (having a high voltage with respect to the substrate 44, which is for example set at 0 V). A secondary voltage $V_2$ (having a low voltage with respect to the substrate 44) is instead supplied, by the first biasing element, to the bonding pad 48b for biasing the plate 48a.

According to a further embodiment (illustrated in FIG. 4A), both the electrode 48a and the pad 48b are similar to the electrode 3 of FIG. 2B.

According to a further embodiment (not illustrated), the metallization 50 is similar to the metallization 48 according to one of the embodiments described previously.

Figure 4A:
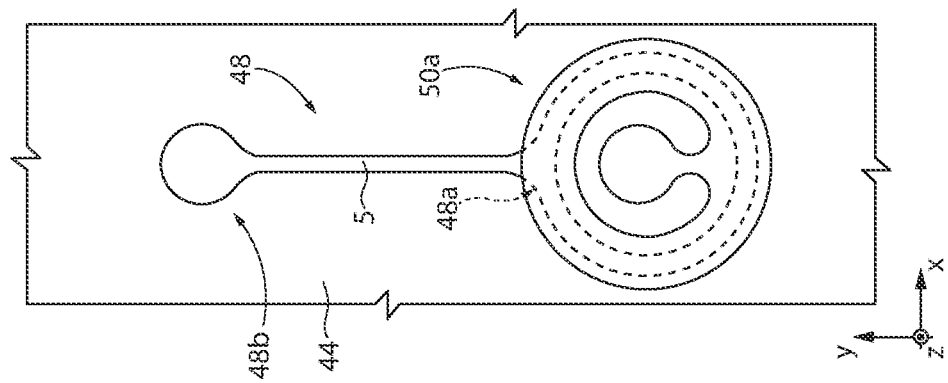
FIGS. 4A-4D are schematic top views, with parts removed for clarity of representation, of respective portions of the electronic device of FIG. 3, which include the electrode structure of FIG. 2A, according to respective embodiments of the present disclosure.
Figure 4B:
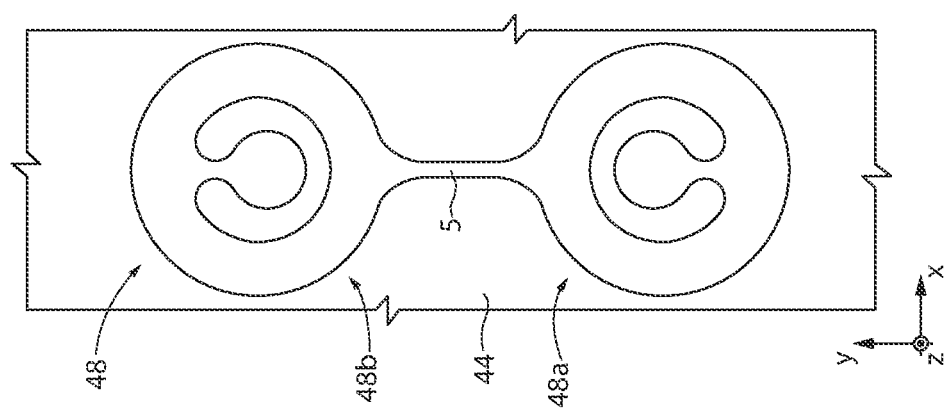
Figure 4C:
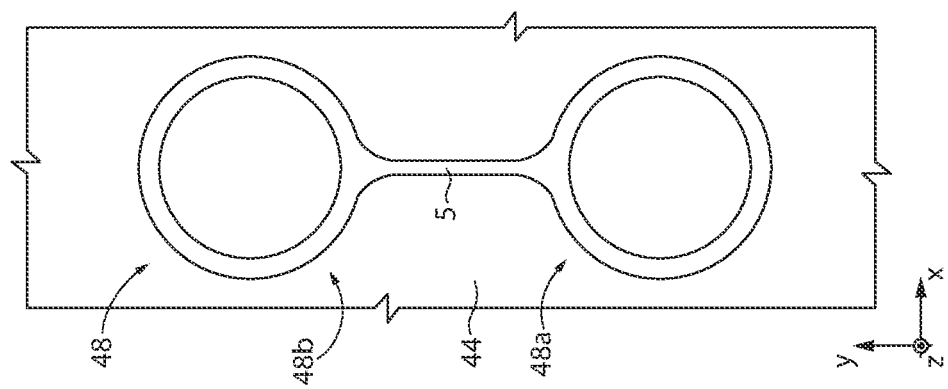

FIGS. 4A-4C show, in the plane XY, the metallization 48 according to respective embodiments. However, it is evident that what has been described with reference to FIGS. 4A-4C can be likewise applied to the metallization 50.

In detail, each of these embodiments makes it possible to generate a respective active capacitance and at least one respective parasitic capacitance. The active capacitance is generated between the metallizations 48, 50 (or between parts thereof) by the dielectric layer 30, whereas the two parasitic capacitances are generated, by the dielectric layer 30 and the insulating layer 46, between the metallization 50 and the substrate 44, and, respectively, between the metallization 48 and the substrate 44.

In the embodiment illustrated in FIG. 4A, both the plate 48a and the bonding pad 48b are similar to the electrode 3 illustrated in FIG. 2, and are physically and electrically coupled to one another through the metal connection 5.

In the embodiment illustrated in FIG. 4B, both the plate 48a and the bonding pad 48b include decoupling elements similar to the annular element 7 (of FIG. 2A and/or FIG. 2B) and are physically and electrically coupled to one another through the metal connection 5. Both the plate 48a and the bonding pad 48b do not have either the central body 9 or the connection portion 11 (with reference to FIG. 2A and/or FIG. 2B). In this case, the annular element 7 does not perform only the aforesaid decoupling function but itself defines the active capacitance of the structure. Furthermore, once a diameter (not illustrated) of the annular element 7 is defined (said diameter here being measured in a direction parallel to the axis X between extreme points of the second side 7b opposite to one another with respect to the center 15, and being equal to $L_3+2 \cdot (L_1+L_2)$), given said diameter: the capacitive couplings of the plate 48a and of the bonding pad 48b of FIG. 4B with the substrate 44 are smaller than the similar capacitive couplings of FIG. 4A; and the capacitive couplings of the plate 48a and of the bonding pad 48b of FIG. 4B with the metallization 50 are smaller than the similar capacitive couplings of FIG. 4A.

Consequently, as compared to the case of FIG. 4A, the plate 48a (and, likewise, the bonding pad 48b) of FIG. 4B makes it possible to reduce both the parasitic capacitance with the substrate 44 and the active capacitance with the metallization 50.

In the embodiment illustrated in FIG. 4C two plates 48a, 48b are present, similar to the electrode 3 illustrated in FIG. 2 and physically and electrically coupled to one another through a metal connection (similar to the metal connection 5). In detail, given the same diameter of the annular element 7 we find that: the first length $L_1$ of the electrode illustrated in FIG. 4C is greater than the first length $L_1$ of the electrode 3 illustrated in FIG. 2; the second length $L_2$ of the electrode illustrated in FIG. 4C is greater than the second length $L_2$ of the electrode 3 illustrated in FIG. 2; and the third length $L_3$ of the electrode illustrated in FIG. 4C is smaller than the third length $L_3$ of the electrode 3 illustrated in FIG. 2. Given these lengths, we find that the annular element 7 of FIG. 4C has both the function of decoupling the mechanical stress (as in FIG. 2) and of forming the active capacitance when coupled to the electrode 50 of FIG. 3. In addition, again with reference to FIG. 4C, the respective central bodies 9 act, in use, as electrical-connection pads.

It is moreover evident that, in view of what has been discussed previously, further and different mutual combinations are possible, here not described, of the elements presented previously.

Figure 4D:
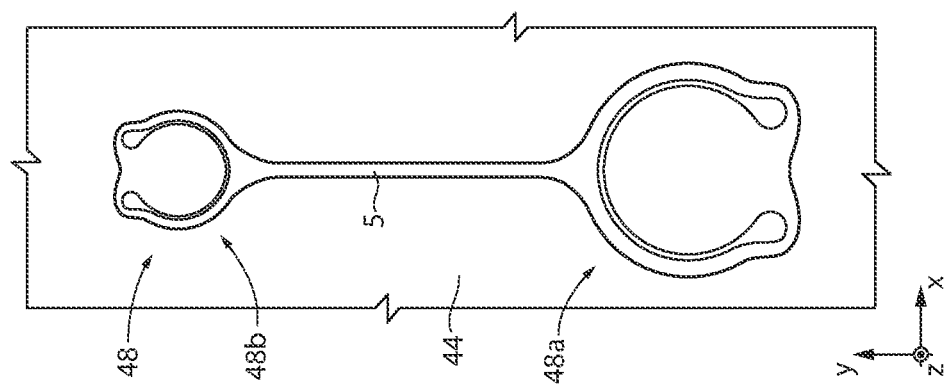

For instance, FIG. 4D shows the metallizations 48 and 50 partially overlapping one another in a direction parallel to the axis Z (the dielectric layer 30 interposed between them is not shown), according to a further embodiment. In FIG. 4D, the plate 48a is similar to the plate 48a of FIG. 4B (and therefore comprises the annular element 7 and does not have the central body 9 and the connection portion 11), and the bonding pad 48b is of a known type and is physically and electrically coupled to the plate 48a through the metal connection 5. In addition, the plate 50a of the metallization 50 is similar to the plate 48a illustrated in FIG. 4C.

In particular, use and combination of the aforesaid plates 48a, 50a makes it possible to:
 (a) reduce the parasitic capacitances of the plate 48a and of the plate 50a with the substrate 44, which are generally kept as low as possible;
 (b) keep the active capacitance between the plates 48a and 50a low in the case where this is desirable for operation of the system;
 (c) in the plate 50a, the connection portion 11 acts as further element for decoupling mechanical stresses between the central body 9 (which can be coupled to the further electrical-connection element in order to operate as wire-bonding area) and the annular element 7 (which provides the active capacitance with the plate 48a): in this way, any possible mechanical stresses or micro-damage caused by the wire-bonding process (which requires or otherwise utilizes application of pressure, ultrasound, and/or high temperatures on the central body 9) does not act directly on the annular element 7, thus reducing the risk of undesired alterations of the active capacitance (in particular, a reduction of a relative distance between the plates 48a and 50a would cause a reduction in the withstand voltage).

In general, electrical coupling between two elements facing one another is directly proportional to a facing area thereof: for example, with reference to the plates 48a, 50a, the mutual capacitive coupling is greater, the more they are facing (or overlapping) one another. The advantages a) and b) deriving from this are listed above.

Consequently, in FIG. 4D, thanks to this combination of the geometrical shape of the plates 48a and 50a, the parasitic capacitances (both the parasitic capacitance that is formed between the plate 48a and the substrate 44 and the parasitic capacitance that is formed between the plate 50a and the substrate 44) decrease in value. In detail, the embodiment of FIG. 4D enables minimization of the parasitic capacitance towards the substrate 44 since the corresponding facing areas are reduced.

FIG. 4E shows metallizations 148 and 150 of a different embodiment of the electronic device (designated hereinafter by the reference number 140 and more fully described with reference to FIG. 5).

In FIG. 4E, the metallizations 148, 150 are illustrated parallelly to the plane XY and partially overlap parallelly to the axis Z (a dielectric layer 130 interposed between them is not shown). The metallization 148 forms a plate 148a' and a plate 148a", both of which are similar to the plate 48a of FIG. 4B (and therefore comprise respective annular elements 7 and do not have the respective central bodies 9 and the respective connection portions 11) and are physically and electrically coupled to one another through a metal connection (similar to the metal connection 5, and therefore designated by the same reference number). Alternatively, the plates 148a' and 148a" are similar to the plate 48a of FIG. 4A or FIG. 4C. The metallization 150 forms a plate 150a' and a plate 150a", both similar to the plate 48a of FIG. 4C and physically and electrically decoupled from one another. The plates 148a' and 150a' at least partially overlap parallelly to the axis Z, and the plates 148a" and 150a" at least partially overlap parallelly to the axis Z. For instance, the plates 150a', 150a" are mutually arranged so that the respective first portions 7' face one another and the respective second portions 7" are opposite to one another.

In greater detail, FIG. 5 shows the electronic device 140 in a section, parallel to the plane YZ, taken along a line of section IV-IV illustrated in FIG. 4E (in detail, parallel to the axis Y and passing through the central bodies 9 of the plates 150a', 150a"). The electronic device 140 provides a plurality of capacitors 142', 142" integrated and set in series with respect to one another, and comprises: a substrate 144, which is similar to the substrate 44 and has a front side 144a; an insulating layer 146, which is similar to the insulating layer 46 and extends over the front side 144a of the substrate 144; the dielectric layer 130, which is similar to the dielectric layer 30 and extends over the insulating layer 146; the metallization 148, which extends in the dielectric layer 130; and the metallization 150, which extends over the dielectric layer 130 so as to partially overlap, in a direction parallel to the axis Z, the metallization 148, as has been discussed previously.

The plates 150a', 150a" can be coupled through known techniques (e.g., wire-bonding techniques) to the first biasing element and the second biasing element, respectively, for example by respective electrical-connection elements (e.g., metal wires). Such electrical-connection elements can be directly coupled to the central bodies 9 of the plates 150a', 150a", enabling biasing of the plates 150a', 150a" (in particular, of the respective annular elements 7) at the primary voltage $V_1$ (having a high voltage with respect to the substrate 144, for example set at 0 V) and, respectively, at the secondary voltage $V_2$ (having a low voltage with respect to the substrate 144). The metallization 148 is instead completely surrounded by the dielectric layer 130 and is of a floating type. In other words, in use it is not directly biased by a respective biasing element, but is biased due to effects of capacitive coupling with the plates 150a', 150a".

Consequently, the plates 148a', 150a' and the portion of the dielectric layer 130 that separates them form the capacitor 142', and the plates 148a", 150a" and the portion of the dielectric layer 130 that separates them form the capacitor 142". The capacitors 142', 142" are integrated in a same electronic device 140 and are arranged with respect to one another in series. From an electrical standpoint, thanks to the series connection of the capacitors 142', 142", the electronic device 140 makes it possible to increase the withstand voltage as compared to the case of a single active capacitance.

In addition, in the plates 150a', 150a", the respective connection portions 11 act as further elements for decoupling mechanical stress between the central bodies 9 and the annular elements 7 (which form the active capacitances with the plates 148a', 148a", and therefore the capacitors 142', 142"), thus reducing the risk of undesired alterations of the active capacitances due to the wire-bonding process, as is described previously.

From an examination of the characteristics of the disclosure obtained according to the present disclosure the advantages that it affords are evident.

In particular, the annular element 7 of the electrode 3 enables a reduction of stress concentration in the dielectric layer 30 at the contact region 19. This stress is caused by expansion or contraction of the metal connection 5 and of the electrode 3 (greater than the expansion or contraction of the dielectric layer 30) following upon thermal cycles carried out on the electronic device 40. In detail, the annular element 7 dissipates the aforesaid stress, distributing in a uniform way in the electrode 3 the forces due to said expansions and/or contractions. In other words, the annular element 7 reduces stress concentration in the electrode 3, preventing excessive local concentrations of stress (e.g., stress higher than 350 MPa in the critical regions 20a, 21a, 20b, 21b).

For instance, assuming that the metal connection 5 and the electrode 3 are of gold (CTE=$14.2e^{-6}$ 1/K and $T_s$=120 MPa, where $T_s$ is the tensile strength) and the dielectric layer 30 is of PIX (CTE=$43e^{-6}$ 1/K, $T_s$=167 MPa), the annular element 7 enables a reduction of the stress on the contact region 19 by approximately 50 MPa as compared to solutions that use electrodes of a known type (e.g., a maximum stress in the contact region 19 is equal to approximately 250 MPa).

Consequently, the likelihood of the dielectric layer 30 being damaged during manufacture or, subsequently, during use of the electronic device 40, is reduced.

It is therefore possible to reduce the risk of cracks and damage to the dielectric layer 30 without having to reduce a thickness, measured parallelly to the axis Z, of the dielectric layer 30. This ensures galvanic insulation and the reliability of electronic device 40.

Moreover, manufacture of the electrode 3 is similar to manufacture of an electrode of a known type and does not require or otherwise rely on further modifications to the process for manufacturing of the electronic device 40.

Furthermore, the electrodes illustrated with reference to FIGS. 4A-4C make it possible to obtain active and parasitic capacitances that are different from one another and can be combined with one another, as described with reference to FIG. 4D so as to obtain different levels of performance of the electronic device 40.

In addition, it is possible to obtain capacitors 142', 142" in series integrated in a same electronic device. These capacitors 142', 142" have improved electrical properties in so far as the respective active capacitances are less dependent upon the wire-bonding process, due to the respective connection portions 11 that decouple the annular elements 7 from the central bodies 9, therefore reducing the risk of deformations of the annular elements 7 due to the aforesaid processes. From an electrical standpoint, the integrated series of the capacitors 142', 142" makes it possible to raise further the withstand voltage as compared to the embodiment of FIG. 3.

Finally, it is clear that modifications and variations may be made to the disclosure described and illustrated herein, without thereby departing from the scope of the present disclosure.

In particular, the electrode 3 can be used whenever a difference in CTE exists between the material of which the metal connection 5 and the electrode 3 are made and the material of which the dielectric layer 30 is made such that in one of the materials stress values comparable with the tensile strength of the material itself are reached.

Moreover, the electrode 3 can be used in any metallization of the electronic device that comprises it (e.g., also in metallizations other than the metallizations 48, 50 as discussed previously).

Furthermore, even though FIG. 5 illustrates two capacitors 142', 142''' in series with respect to one another, it is possible to increase the number of capacitors in series by comprising a larger number of plates in the metallization 150, with the further advantage of increasing the withstand voltage of the electronic device 140.

An electrode structure (1) may be summarized as including a first pad (3) of conductive material; and a conductive strip (5) having a first end (5*a*) physically and electrically coupled to the first pad (3), characterized in that the first pad (3) including a first annular element (7) internally defining a first through opening (13), and in that the first end (5*a*) of the conductive strip (5) is physically and electrically coupled to the first annular element (7) through a first transition region (19) so that, when the conductive strip (5) undergoes expansion by the thermal effect, a stress is transferred from the conductive strip (5) to the first annular element (7) through the first transition region (19).

Said first transition region (19) may have a tapered shape that widens towards the first annular element (7).

The tapered shape of the first transition region (19) may be delimited by curved lateral surfaces having a respective radius of curvature ($r_1$) greater than or equal to approximately 50 µm.

The first pad (3) may further include a first central body (9), of conductive material, which extends in the first through opening (13) and is at least partially surrounded at a distance by said first annular element (7), the first central body (9) and the first annular element (7) being physically and electrically coupled together through a first connection portion (11) diametrally opposite to the first transition region (19).

The conductive strip (5) may have a main extension along a first axis (Y), the first connection portion (11) and the first transition region (19) being opposite to one another with respect to the first central body (9) along said first axis (Y).

The first annular element (7) may have a first curved portion and a second curved portion (22*b*) between the first transition region (19) and the first connection portion (11), which face respective sides of the first central body (9) that are specular with respect to the first axis (Y).

The first central body (9) may be externally delimited by a lateral surface (9*a*) of its own directly facing a respective portion of lateral surface of the first annular element (7) through said first through opening (13).

The first annular element (7) may be formed of two sub-elements each having the shape of a semi-annulus and coupled together and mutually arranged so as to define the first through opening (13).

An electronic device (40; 140) including an electrode structure (1) may be summarized as including a substrate (44; 144) having a front side (44*a*; 144*a*); a dielectric region (30, 46; 130, 146) extending starting from the front side (44*a*; 144*a*) of the substrate (44; 144); a first metallization (48; 148) including said first pad (3), extending in the dielectric region (30, 46; 130, 146) and forming a first plate (48*a*; 148*a'*) of a first capacitor (42; 142'); and a second metallization (50; 150) including a second plate (50*a*; 150*a'*) of the first capacitor (42; 142'), extending over the dielectric region (30, 46; 130, 146), wherein a portion of the dielectric region (30, 46; 130, 146) extends between the first plate (48*a*; 148*a'*) and the second plate (50*a*; 150*a'*) that at least partially overlap between them to form, with said portion of the dielectric region (30, 46; 130, 146), the first capacitor (42; 142').

The first metallization (48) may further include a bonding pad (48*b*) coupled to the first plate (48*a*) by said conductive strip (5), the dielectric region (30, 46) exposing the bonding pad (48*b*) so that a biasing element may be couplable to the bonding pad (48*b*) for biasing the first plate (48*a*) at a first voltage ($V_2$), and wherein the second plate (50*a*) may be couplable to a further biasing element for being biased, by said further biasing element, at a second voltage ($V_1$) higher than the first voltage ($V_2$).

A second pad (3) of conductive material forms the second plate (50*a*), the second pad (3) may include a second annular element (7) internally defining a second through opening (13).

The second plate (150*a'*) may be formed by a second pad (3) of conductive material that includes: a second annular element (7) internally defining a second through opening (13); and a second central body (9), of conductive material, which extends in the second through opening (13) and may be couplable to a biasing element for biasing, by said biasing element, the second annular element (7) at a first voltage ($V_1$), wherein the first metallization (148) may be floating and may further include a third pad (3) of conductive material that extends in the dielectric region (130, 146), forms a third plate (148*a"*), and may include a third annular element (7) internally defining a third through opening (13), the conductive strip (5) further having a second end, opposite to the first end (5*a*), physically and electrically coupled to the third annular element (7) through a third transition region (19) so as to electrically contact together the first plate (148*a'*) and the third plate (148*a"*), wherein the second metallization (150) may further include a fourth pad (3) of conductive material, which extends over the dielectric region (130, 146) and forms a fourth plate (150*a"*) electrically decoupled from the second plate (150*a'*), the fourth pad (3) including: a fourth annular element (7) internally defining a fourth through opening (13); and a third central body (9), of conductive material, which extends in the fourth through opening (13) and may be couplable to a further biasing element for biasing, by said further biasing element, the fourth annular element (7) at a second voltage ($V_2$), and wherein a further portion of the dielectric region (130, 146) extends between the third plate (148*a"*) and the fourth plate (150*a"*) that may be at least partially overlapping one another to form, with said further portion of the dielectric region (130, 146), a second capacitor (142") arranged in series with the first capacitor (142').

The dielectric region (30, 46) may include a dielectric layer (30) of polymeric material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrode structure, comprising:
a first pad of conductive material, including:
a first central body having a perimeter; and
a first annular element having an inner surface opposite an outer surface, the perimeter of the first central body facing the inner surface of the first annular element, the inner surface being spaced from the outer surface in a first direction for a first dimension;
a first through opening between the first central body and the first annular element; and
a conductive strip having a first end physically and electrically coupled to the first pad, and
wherein the first end of the conductive strip is physically and electrically coupled to the first annular element through a first transition region, a second dimension in the first direction is from the inner surface of the first annular element to the perimeter of the first central body, the first dimension being greater than the second dimension.

2. The electrode structure according to claim 1, wherein said first transition region has a tapered shape that widens towards the first annular element.

3. The electrode structure according to claim 2, wherein the tapered shape of the first transition region is delimited by curved lateral surfaces having a respective radius of curvature greater than or equal to approximately 50 µm.

4. The electrode structure according to claim 1, wherein the first central body is of conductive material and is at least partially surrounded by said first annular element, the first central body and the first annular element being physically and electrically coupled together through a first connection portion diametrically opposite to the first transition region.

5. The electrode structure according to claim 4, wherein the conductive strip has a main extension along a first axis, the first connection portion and the first transition region being opposite to one another with respect to the first central body along said first axis.

6. The electrode structure according to claim 5, wherein the first annular element has a first curved portion and a second curved portion between the first transition region and the first connection portion, which face respective sides of the first central body that are specular with respect to the first axis.

7. The electrode structure according to claim 4, wherein the first central body is externally delimited by a lateral surface of its own directly facing a respective portion of the inner surface of the first annular element through said first through opening.

8. The electrode structure according to claim 1, wherein the first annular element is formed of two sub-elements each having the shape of a semi-annulus and coupled together and mutually arranged so as to define the first through opening.

9. An electronic device, comprising:
an electrode structure, the electrode structure including:
a first pad of conductive material including a first central body spaced from an inner surface of a first annular element in a first direction, a first dimension is between the first central body and the first annular element, the first annular element having a second dimension in the first direction between the inner surface and an opposite outer surface, the first dimension is less than the second dimension;
a first through opening; and
a conductive strip having a first end physically and electrically coupled to the first pad, the first annular element being around the first through opening, and
wherein the first end of the conductive strip is physically and electrically coupled to the first annular element through a first transition region;
a substrate having a front side;
a dielectric region on the front side of the substrate;
a first metallization including the first pad, extending in the dielectric region;
a first plate of a first capacitor that includes the first metallization; and
a second metallization including a second plate of the first capacitor, extending over the dielectric region, the dielectric region extending in a second direction transverse the first direction between the first metallization and the second metallization.

10. The electronic device according to claim 9, wherein:
the first metallization further includes a bonding pad coupled to the first plate by said conductive strip;
the dielectric region exposes the bonding pad so that a biasing element is couplable to the bonding pad for biasing the first plate at a first voltage; and
the second plate is couplable to a further biasing element for being biased, by said further biasing element, at a second voltage higher than the first voltage.

11. The electronic device according to claim 9, wherein a second pad of conductive material forms the second plate, the second pad including a second annular element internally defining a second through opening.

12. The electronic device according to claim 9, wherein the second plate is formed by a second pad of conductive material that includes:
a second annular element internally defining a second through opening; and
a second central body, of conductive material, which extends in the second through opening and is couplable to a biasing element for biasing, by said biasing element, the second annular element at a first voltage, wherein:
the first metallization is floating and further includes a third pad of conductive material that extends in the dielectric region, forms a third plate, and includes a third annular element internally defining a third through opening, the conductive strip further having a second end, opposite to the first end, physically and electrically coupled to the third annular element through a third transition region so as to electrically contact together the first plate and the third plate;
the second metallization further includes a fourth pad of conductive material, which extends over the dielectric region and forms a fourth plate electrically decoupled from the second plate, the fourth pad including: a fourth annular element internally defining a fourth through opening; and a third central body, of conductive material, which extends in the fourth through opening and is couplable to a further biasing element for biasing, by said further biasing element, the fourth annular element at a second voltage; and
a further portion of the dielectric region extends between the third plate and the fourth plate that are at least partially overlapping one another to form, with said further portion of the dielectric region, a second capacitor arranged in series with the first capacitor.

13. The electronic device according to claim 9, wherein the dielectric region includes a dielectric layer of polymeric material.

14. The electronic device according to claim 9, wherein the first transition region has a tapered shape that is delimited by curved lateral surfaces having a respective radius of curvature greater than or equal to approximately 50 µm.

15. An electrode, comprising:
a first conductive pad including a first annular element around a first through opening, the first conductive pad having a first central body spaced from the first annular element for a first dimension via the first through opening, a second dimension is between an outer surface of the first annular element and an inner surface of the first annular element, the first dimension is less than the second dimension, a diameter of the first central body being a third dimension that is greater than the second dimension; and
a conductive strip having a first end coupled to the first annular element through a first transition region.

16. The electrode according to claim 15, wherein the first transition region has a tapered shape that is delimited by curved lateral surfaces having a respective radius of curvature greater than or equal to approximately 50 µm, the first central body extends in the first through opening and is at least partially surrounded by the first annular element, the first central body and the first annular element being physically and electrically coupled together through a first connection portion diametrically opposite to the first transition region.

17. The electrode according to claim 16, wherein the conductive strip has a main extension along a first axis in the first direction, the first connection portion and the first transition region being opposite to one another with respect to the first central body along the first axis.

18. The electrode according to claim 17, wherein the first annular element has a first curved portion and a second curved portion between the first transition region and the first connection portion, which face respective sides of the first central body that are specular with respect to the first axis.

19. The electrode according to claim 16, wherein the first central body is externally delimited by a lateral surface directly facing a respective portion of a lateral surface of the first annular element through the first through opening.

20. The electrode according to claim 15, wherein the first annular element is formed of two sub-elements each having the shape of a semi-annulus and coupled together and mutually arranged to define the first through opening.

* * * * *